United States Patent
Zitelli et al.

[11] 4,016,557
[45] Apr. 5, 1977

[54] AUTOMATIC GAIN CONTROLLED AMPLIFIER APPARATUS

[75] Inventors: William E. Zitelli, Media; Andras I. Szabo, Export, both of Pa.

[73] Assignee: Westinghouse Electric Corporation, Pittsburgh, Pa.

[22] Filed: May 8, 1975

[21] Appl. No.: 575,679

[52] U.S. Cl. .................... 340/347 AD; 330/124 R; 340/15.5 GC
[51] Int. Cl.[2] .................... H03K 13/02; H03G 3/00
[58] Field of Search ............ 340/347 AD, 347 NT, 340/15.5 GC; 330/124 R

[56] References Cited
UNITED STATES PATENTS

| | | |
|---|---|---|
| 3,464,022 | 8/1969 | Locheed, Jr., et al. .... 340/15.5 GC |
| 3,525,948 | 8/1970 | Sherer et al. ............ 340/15.5 GC |
| 3,559,180 | 1/1971 | Joly ........................ 340/15.5 GC |
| 3,577,140 | 5/1971 | Aasnaes ..................... 340/347 NT |
| 3,613,111 | 10/1971 | Moede ........................ 340/347 AD |
| 3,699,325 | 10/1972 | Montgomery, Jr., et al. .... 340/15.5 GC |
| 3,754,240 | 8/1973 | Milton ...................... 340/347 NT |
| 3,790,886 | 2/1974 | Kurtin et al. ............... 340/347 NT |
| 3,813,609 | 5/1974 | Wilkes et al. ............... 330/124 R |

OTHER PUBLICATIONS

Boinodiris: Event Controller Useful for Analog Signal Handling, IBM Tech. Disclosure Bull., vol. 16, No. 7, Dec. 1973, pp. 2094–2095.

Primary Examiner—Felix D. Gruber
Attorney, Agent, or Firm—C. M. Lorin

[57] ABSTRACT

In an analog data acquisition system, used for digital treatment, analog signals of different levels received from remote locations are amplified with a selected gain before being converted by a common A/D converter. A discretely variable gain amplifier is used in which a series of programmed predetermined ranges are sequentially tested against the capability of the A/D converter in relation to the particular input analog signal. The first acceptable gain is selected and a code can be used to identify the selected gain for digital treatment of the derived corresponding digital signal.

2 Claims, 7 Drawing Figures

AUTOMATIC GAIN CONTROLLED AMPLIFIER APPARATUS

BACKGROUND OF THE INVENTION

The invention relates in general to analog data acquisition system and more particularly to analog signal multiplexing systems interfaced with a digital system through an analog to digital converter.

Analog data acquisition systems are used in many industrial applications, such a process control, data logging, supervisory instrumentation, etc. A typical analog data acquisition system of the prior art is described in U.S. Pat. No. 3,806,916 issued Apr. 23, 1974 of same assignee as the assignee of the present application. Basically, such systems derive analog information from a plurality of remote locations and gather the analog data at a central location where it is converted into digital form for subsequent digital treatment by a suitable utilization device, such as a computer. Essential components of the data acquisition system are the multiplexer selecting one of the plurality of input analog signals from the remote locations and the A/D converter into which each particular input analog signal is inputted.

The A/D converter is used to convert the input analog signal into a digital representation thereof, generally in the form of a pulse count corresponding to the inputted analog signal. Various types of devices can be used for such purpose. Most typically used is the dual slope integration device in which the signal is integrated during a fixed time and is counted during a variable time. Whatever the type used, the inputted analog signal must not exceed a certain level which would be beyond the capability of the particular A/D converter. In order to accommodate the inputted analog signals to the capability of the converter, several methods have been used in the prior art. One is to group the signals in accordance with a common range of magnitude and to associate one A/D converter of designed capability with each such grouping. This is an expensive solution. Another solution is to use a variable gain amplifier which is adjusted for each measurement to the gain required for proper operation by the A/D converter. However, this second solution raises some problems. Each inputted signal must be identified as to channel and gain and the selection of the gain must be accordingly accomplished on the amplifier. When many points must so be monitored by the data acquisition system, it can be appreciated that while the use of a local Analog Multiplex Substation (AMS) reduces the length of the cabling from the computer, nevertheless, an excessive core memory is needed to store both the address of each channel and the gain setting required. This is very costly. Moreover, the analog transducer outputs may vary in amplitude over a wide range at the neighboring locations, and grouping of transducer both as to space and range may not be possible. In such instances the analog input signal must be sequenced without regard to the amplitude ranges. Digital control of the gain has thus become necessary from the central computer. Software programming may then be required to randomly access each channel at the appropriate time in the acquisition or control sequence.

An object of the present invention is to provide an improved data acquisition system for the reception of analog signals of different ranges of magnitude.

Another object of the present invention is to provide a data acquisition system in which the received analog signals are automatically converted into signals within the capability of the A/D converter used in the system.

A further object of the present invention is to provide digital treatment of analog data acquired and converted by an A/D converter in which the range of the acquired analog signal is more easily and less expensively identified.

SUMMARY OF THE INVENTION

The invention relates to analog data acquisition systems in which input analog signals of different amplitude ranges are received from remote locations and multiplexed before being passed through an A/D converter for digital treatment. An amplifier having a discretely adjustable gain is interposed between the received input analog signal and the A/D converter. The range of the input analog signal received is tested against a predetermined limit range which exceeds the capability of the A/D converter so as to derive a digital enable signal and a digital sequencer is actuated by the enable signal in order to shift the setting of the amplifier from one gain to the next. The series of gains built in the amplifier are obtained by programming of a combination of elementary circuits which each contribute individually to a definite gain. A Read Only Memory (R.O.M.) unit is used for such combinational programming. The logic of the sequence determines incrementation of the R.O.M. stored instructions.

BRIEF DESCRIPTION OF THE DRAWINGS

FIG. 4A shows the selective gain differential amplfier. FIG. 4B is the window comparator. FIG. 4C is the sequencer and R.O.M. portions of the circuit of FIG. 2.

THE AUTOMATIC GAIN-CONTROLLED AMPLIFIER APPARATUS

Figure 1:
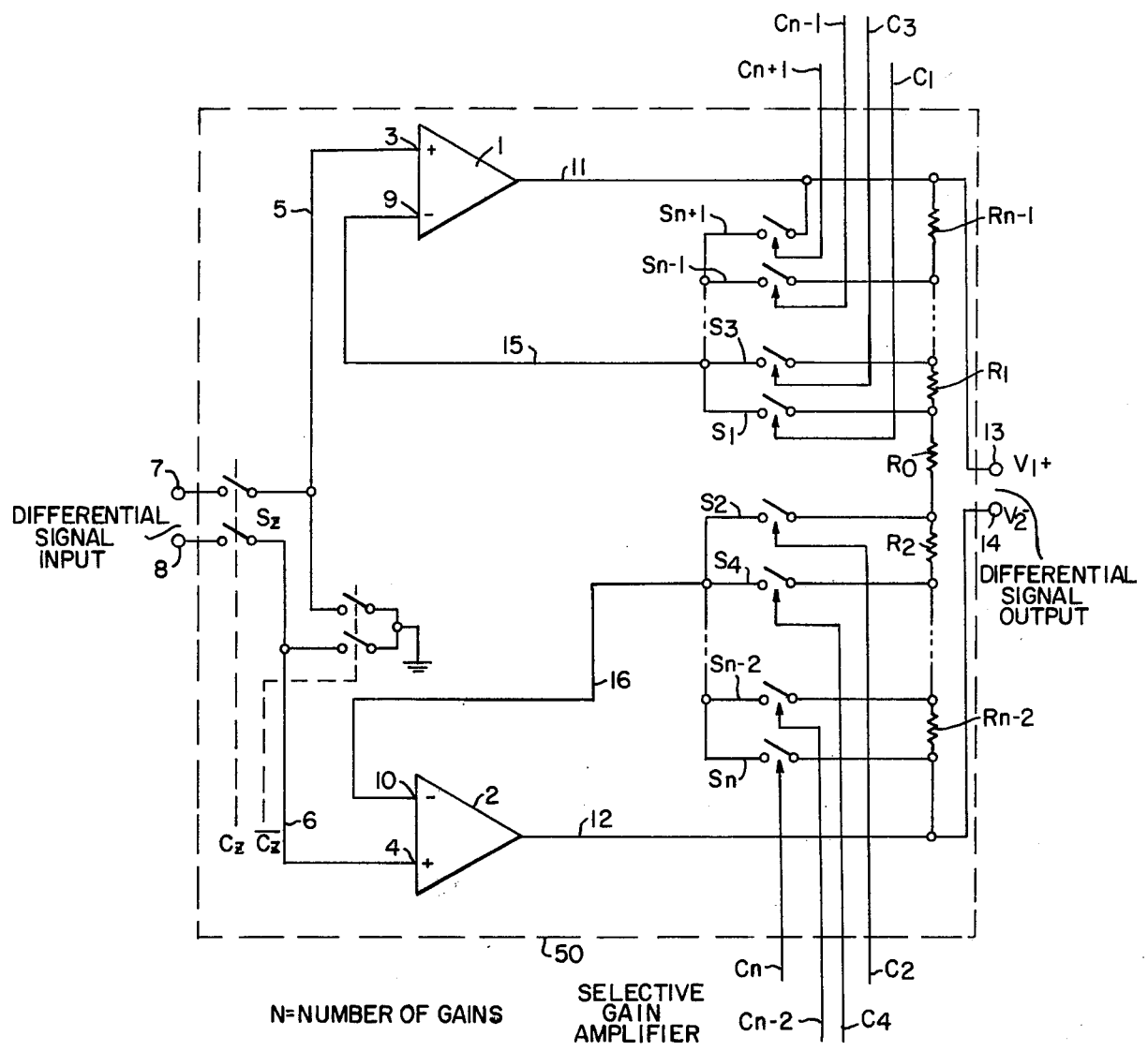
FIG. 1 shows the selective gain differential amplifier according to the present invention in its preferred form.

Automatic gain control of an amplifier is well known. An amplifier apparatus of this type generally includes a negative feedback loop automatically changing the gain of the amplifier whenever the input signal increases, or decreases.

In contrast, the automatic gain-controlled amplifier apparatus according to the present invention includes an amplifier having a series of gain settings and a digital control loop comprising a sequencer for selecting each gain setting in a predetermined order, preferably preprogrammed, after initiation by a fed back digital signal indicating that the output signal exceeds a predetermined range. The fed back digital signal indicates "enable" when the sequencer must be actuated. It indicates "inhibit" once the acceptable gain setting has been switched on, when sequencing must be stopped and the sequencer reset.

Such automatic gain-controlled amplifier apparatus can be used for measuring an analog signal at a desired scale when it is coupled to an indicator. The scale used is known from the gain setting as automatically adjusted, and instrument reading can easily be automatically set to the proper scale in relation to actual gain setting.

The invention will be described with particularity in the context of an analog data acquisition system in which a plurality of input analog signals are received by multiplexing and are fed sequentially, or at random, to the automatic gain-controlled amplifier apparatus according to the present invention. More specifically, the description will relate to a digital system including such analog data acquisition system. Since, with such arrangement, the object is mainly to reduce instrumentation cabling runs otherwise necessary with the remotely located central digital computer, the transducer signals within the analog data acquisition system are grouped around a local analog multiplex substation (AMS) embodying a multiplexer and an analog-to-digital (A/D) converter. The automatic gain-controlled amplifier apparatus according to the present invention serves to amplify the analog transducer signals before they are inputted into the A/D converter. The gain setting needed to match the particular channel selected by the multiplexer is no longer called for by the computer. The gain is automatically set locally by operation of the earlier mentioned sequencer.

The sensing devices grouped around a local AMS may generate analog signals of quite different magnitudes. For instance, a thermocouple would provide signals of the order of the millivolt, whereas a pressure transducer would generate signals of the order of the volt. A different gain is needed to provide a signal that can be handled by the A/D converter of the local AMS. An amplifier amplifies the analog signals before A/D conversion with the proper gain setting. Therefore, it is necessary that such amplifier can be adjusted to as many gain settings as required by the nature of the transducers. The selectable gains are built-in with resistors which can be switched in, or out, depending upon the channel selected by the multiplexer at the input of the amplifier. Thus, there is a correlation between the nature of each selectable transducer and the respective resistors, or combinations of resistors, available on the amplifier.

If the gain settings are to be selected were in a regular progression, a regular arrangement of resistors could be built-in and the selection could be made by regular steps as in any measuring instrument to provide the various measuring scales. However, analog signals in a data acquisition system generally differ to a large extend from one another so that the gain settings do not have any common relation within the group. Besides, there is a better way to build-in a series of gain settings than associating one particular resistor to each gain setting, which would require switching one out before switching another in. Scanning through the various gains is more efficiently performed when the successive gains result from merely adding or substracting one resistor at a time in a sequence. FIG. 1 illustrates an arrangement of resistors and switches having such favorable feature.

The amplifier of FIG. 1 includes two operational amplifiers 1, 2 connected as a differential amplifier to receive between the noninverting input terminals 3, 4 a differential signal received on lines 5, 6 from input terminals 7, 8 and from the multiplexer (not shown). The output terminals 13, 14 are connected to an A/D converter (not shown). Between lines 11, 12 respectively connecting the outputs of the two operational amplifier to the output terminals 13, 14, are mounted $(n-1)$ resistors $R_1 \ldots R_{n-1}$ which are conveniently disposed alternately on one side and the other of a central resistor $R_0$. Switches $S_1$ to $S_{n+1}$ are also associated each with one end of the resistor of same n index except the two last switches $S_N$ and $S_{n+1}$ which are connected to a corresponding one of the opposite lines 11, 12. The switches of odd numbers are grouped and connected via feedback line 15 to the inverting input 9 of operational amplifier 1. Similarly the switches of even numbers are grouped and connected via feedback line 16 to the inverting input 10 of operational amplifier 2. Each switch is controlled by one signal from the respective line $C_1$ through $C_{n+1}$. These are activated in sequence two by two so that one resistor alternately of one group is switched in or out, through the succession of resistors $R_0, R_1 \ldots R_{n-1}$.

With such arrangement the values of the resistors $R_1$ through $R_{n-1}$ are calculated in relation to the gain setting $G_1$ through $G_n$ required, with the resistance of resistor $R_0$ initially known, as follows:

If $R_T$ is the sum of all the resistors mounted between lines 11 and 12 the gains are:

$$G_1 = \frac{R_T}{R_0} \quad G_2 = \frac{R_T}{R_0 + R_1} \quad G_3 = \frac{R_T}{R_0 + R_1 + R_2} \quad G_i = \frac{R_T}{\sum_{u=0}^{i-1} R_n}$$

where $$R_T = \sum_{i=0}^{N-1} R_i = G_1 R_0$$

for the first gain setting; where $$G_2 R_0 + G_2 R_1 = R_T = G_1 R_0$$

and $$R_1 = G_1 R_0 - G_2 R_0 / G_2$$

for the second gain setting; where $$G_3(R_0 + R_1) + G_3 R_2 = G_1 R_0$$

and $$R_2 = G_1 R_0 - G_3(R_0 + R_1)/G_3$$

for the third gain setting.

It follows that the general formula for the gain of rank $G_{i+1}$ is:

$$R_i = \frac{G_1 R_0 - G_{i+1} \sum_{n=0}^{i-1} R_n}{G_{i+1}} \tag{1}$$

If for example these particular transducers as grouped call for the following gains:

$G_1 = 250$
$G_2 = 100$
$G_3 = 25$
$G_4 = 10$
$G_5 = 2.5$
$G_6 = 1$ the respective resistors calculated with the held of equation (1) become:

$$R_1 = \frac{250R_o - 100*R_o}{100} = 1.5\ R_o$$

$$R_2 = \frac{250R_o - 25*2.5R_o}{25} = 7.5\ R_o$$

$$R_3 = \frac{250R_o - 10*10R_o}{10} = 15\ R_o$$

$$R_4 = \frac{250R_o - 2.5*25R_o}{2.5} = 75\ R_o$$

$$R_5 = \frac{250R_o - 1*100R_o}{1} = 150\ R_o$$

FIG. 1 illustrates the resistors which are combined by adding, or subtracting, one of them alternately from one side of central resistor $R_0$ under control of lines such as $C_1 \ldots C_{n+1}$. More generally, for each gain setting the user must be able to calculate elementary resistors and specific combinations thereof obtained by switching, given a certain group of transducers around an AMS. In accordance with the present invention, a selective gain amplifier apparatus is provided in which the gain settings are programmable. To this effect a Read Only Memory is associated with the control lines such as $C_1 \ldots C_{n+1}$, and a logic address circuit is controlled by the sequencer in order to scan through the control lines $C_1 \ldots C_{n+1}$. Thus, any form of conbinational switching of resistors may be programmed, in the field by the user, on the R.O.M. device.

Figure 2:
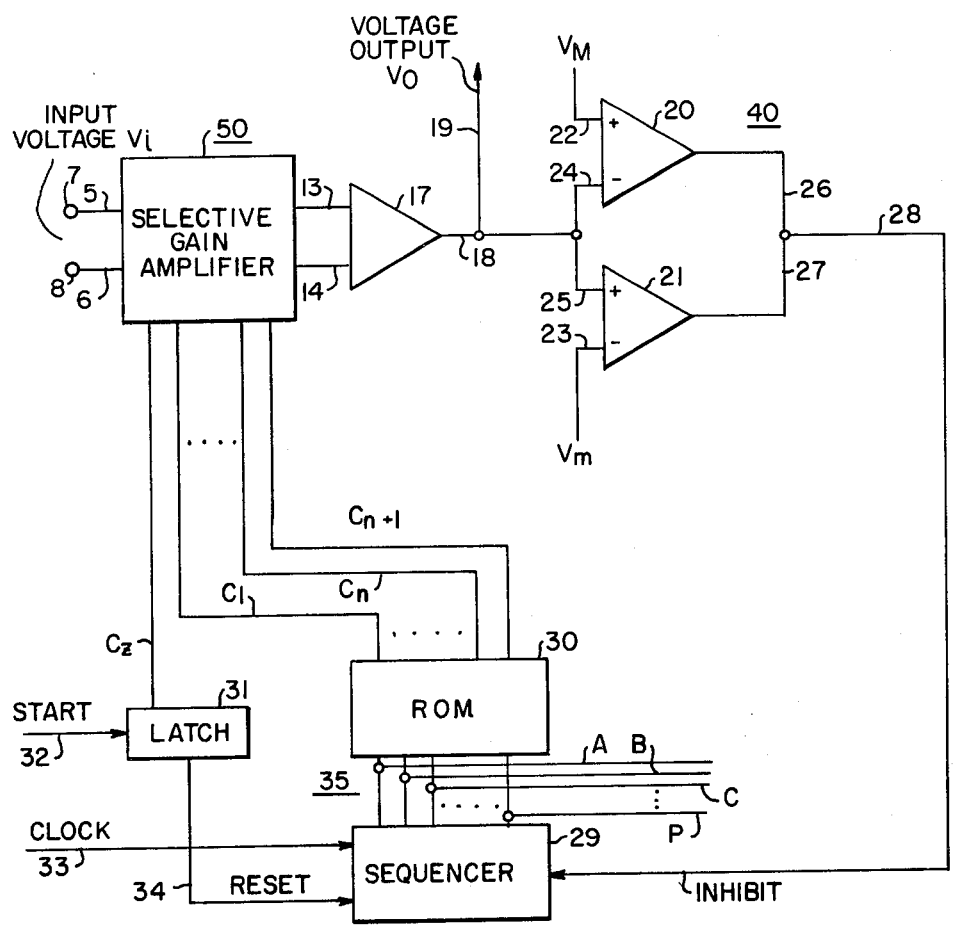
FIG. 2 shows in block diagram the automatic gain-controlled amplifier apparatus according to the present invention.

An overall view of the automatic gain controlled amplifier apparatus according to the present invention is shown in FIG. 2. A selective gain amplifier 50 such as illustrated in FIG. 1 is supplying an output signal on lines 13, 14 to a differential to single-ended signal converter 17 generating an output signal on lines 18 and 19. The output voltage $V_o$ so derived constitutes an amplified representation of the analog input signal received on lines 5, 6 from the multiplexer (not shown). The output voltage $V_o$ is fed to an A/D converter (not shown) providing a digital representation of the magnitude of $V_o$. Line 18 is also connected to the inverting input of analog comparator 20 and to the noninverting input of analog comparator 21. The noninverting input of analog comparator 20 is connected to a reference potential $V_M$ which is the maximum voltage that the A/D converter (not shown) can handle. The inverting input of analog comparator 21 is connected to a reference potential $V_m$ which is the minimum voltage that the A/D converter can handle. Thus a window comparator 40 is provided having an output on line 28 from the analog comparators 20, 21. This output is either one of two different potentials. One potential corresponds to the condition that $V_0$ is between the two extreme voltage references $V_m$, $V_M$. The other corresponds to the condition that $V_o$ is outside the range set by $V_m$ and $V_M$. Therefore, line 28 which is derived from the junction of lines 26, 27, actually carries a digital signal. A sequencer 29 is gated by the digital signal on line 28, so as to generate on parallel address lines 35 a coded representation of the successive counts, which are read by the R.O.M. (Read Only Memory) device 30. An illustration of the R.O.M. device 30 is given by FIG. 3. The matrix shown fits the requirement of closing two switches at a time, as earlier explained with respect to resistors $R_0, R_1 \ldots R_{n-1}$, and by reference to the selective gain amplifier 50 of FIG. 1. The illustration of FIG. 3 assumes $n = 6$, (e.g. 6 gains) thus five resistors besides resistor $R_0$. The logic states 0 to 5 representing the binary codes 000 to 101 are derived on lines 35 from an octal sequencer 29. When logic state 0 is defined by the sequencer, lines $C_1$ and $C_2$ are activated, line $C_1$ as the junction point between line 0 and column $C_1$ on the matrix, line $C_2$ via diode $D_0$. Therefore switches $S_1$ and $S_2$ are closed and resistors $R_0$ to $R_{n-1}$ are all in circuit between output lines 11, 12, while only resistor $R_0$ is inserted in the feedback loop between lines 15 and 16. It is clear from the classical operation of a differential amplifier that when $S_1$ and $S_2$ are closed, between lines 13 and 14 the output signal appears between all the resistors whereas the input signal injected between lines 5 and 6 also appear between feedback lines 15, 16 thus resistor $R_0$. The gain is determined by the divider so defined. Thus, $(R_0+R_1+R_2+\ldots R_5)/R_0$ is the gain for logic-state zero, and in the specific case illustrated, when $R_0 = 1$, the gain setting is equal to:

$$(1 + 1.5 + 7.5 + 15 + 75 + 150)/1 = 250$$

Figure 3:
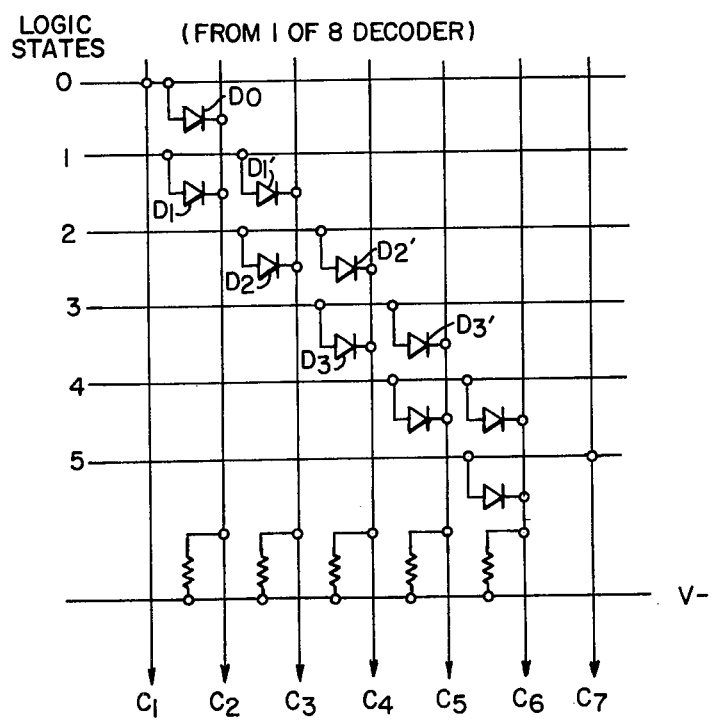
FIG. 3 illustrates an arrangement for a R.O.M. configuration to be used with an octal sequencer in the automatic gain-controlled amplifier apparatus of FIG. 2.

Similarly when sequencer 29 establishes the logic 1, lines $C_2$ and $C_3$ are activated via respective diodes $D_1$, $D_1{}^1$. Therefore switches $S_2$ and $S_3$ are switched on. This means that resistors $R_0$ and $R_1$ are now in circuit in the feedback loop between lines 15 and 16. The gain has been reduced to $$(R_0+R_1+R_2 \ldots + R_5)/\ R_0+R_1$$

or $$(1 + 1.5 + 7.5 + 15 + 75 + 150)/(1 + 1.5) = 100$$

and so on, with the logic states 2 to 5. The last state 5 activates $C_6$ and $C_7$ thus switches $S_6$ and $S_7$. All resistors $R_0$ to $R_5$ are now in circuit both between lines 15 and 16 and between lines 13 and 14, thus providing a gain of unity between the input and the output of the differential amplifier (1, 2). As shown in FIG. 1 the multiplexer provides an input signal between line terminal 7, 8 which is switched into the selective gain amplifier via a double-throw switch $S_z$ controlled by complementary lines $C_z$, $\overline{C_z}$. Line $C_z$ is shown in FIG. 2 as a control line from a latch device 31 which is also used to reset the sequencer 29 via line 34. A clock 33 controls the timing of the counts of sequencer 29. Operating of the sequencer is initiated when the signal on line 28 is "ENABLE," e.g. when the output from the selective gain amplifier 50 exceeds one of the limits set by the window comparator. When counting, sequencer 29 scans through the R.O.M. 30, control lines $C_1$ to $C_{n+1}$ are successively energized in pairs, so as to switch a particular resistor according to FIG. 1. However, FIG. 3 shows only one possible way of combining prearranged resistors. Control lines $C_1$ to $C_{n+1}$ may be combined in another fashion as prescribed by the particular diode arrangement within the R.O.M. device. Once the correct gain setting has been found, the output signal on line 28 from the window comparator 40 becomes an "inhibit" signal which stops the sequencer 29. When the multiplexer scans to the next channel, a start signal on line 32 caused the switch $S_z$ to supply the subsequent analog input signal to the selective gain amplifier 50, while the latch device 31 removes the reset from the sequencer via line 34 to allow it to count. The logic state zero is operative to select the highest available gain. At this time, if the window comparator 40 does not detect any out of range signal on line 18, line 28 will inhibit operation of the sequencer. The first gain setting selected by the first combination of control lines $C_1 \ldots C_{n+1}$ is the correct gain setting. If the signal on line 18 is out of range, the sequencer 29 enabled and sequencing through the R.O.M. 30 is initiated in the same manner as already stated, thus calling for the next combination of lines $C_1 \ldots C_n$ fixed by the R.O.M. 30, and all subsequent ones thereafter, each reducing the gain until the correct gain setting is reached. The signal on line 28 then becomes "inhibit."

DESCRIPTION OF THE PREFERRED EMBODIMENT

Figure 4A:
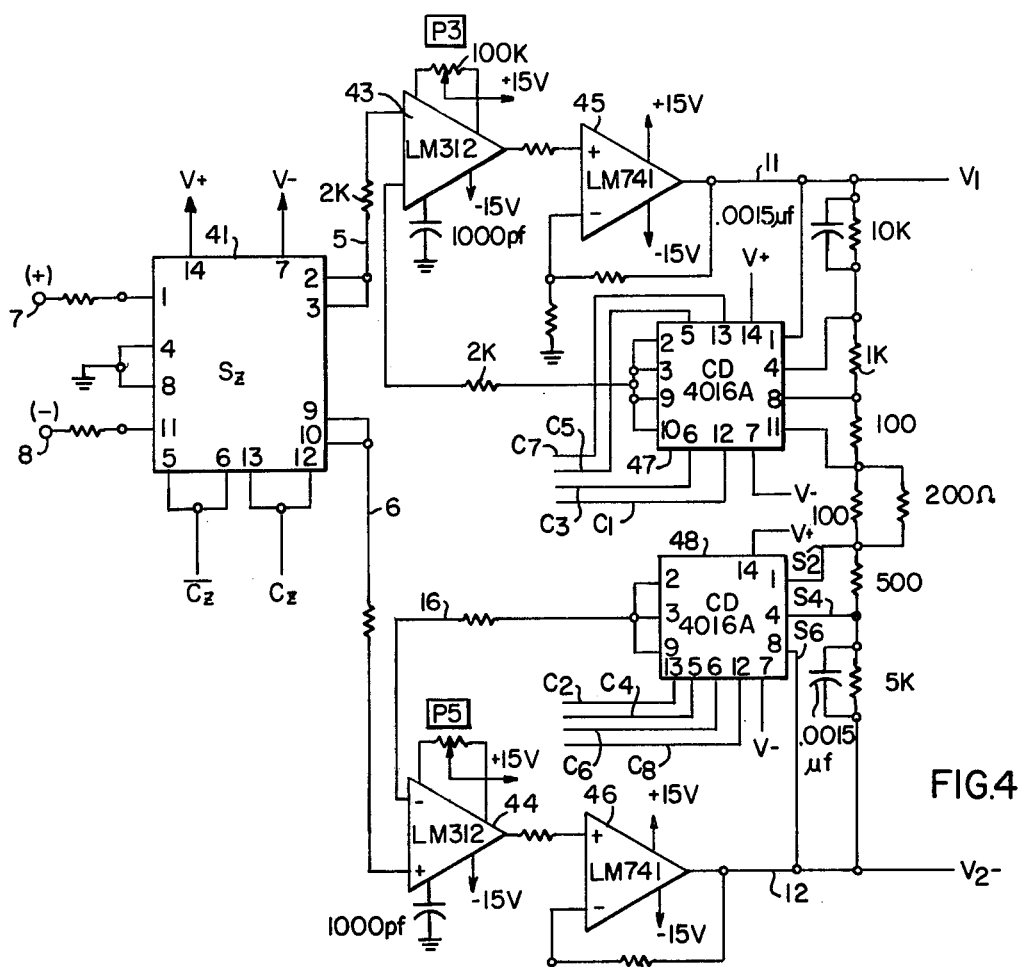
FIGS. 4A, 4B, 4C show in more detail the automatic gain-controlled amplifier apparatus of FIG. 2 in the preferred embodiment.
Figure 4B:
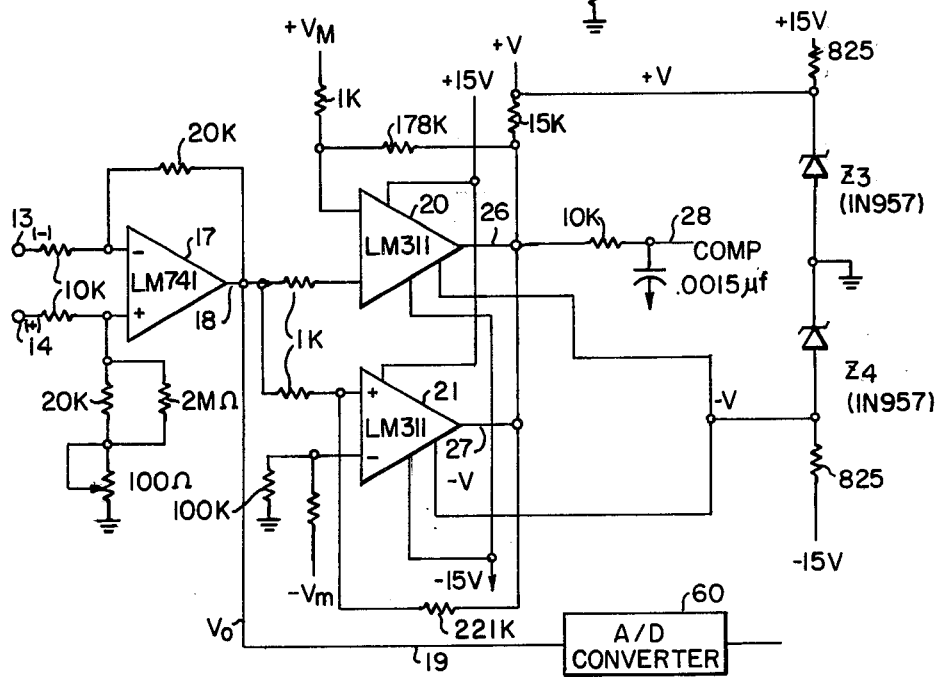
Figure 4C:
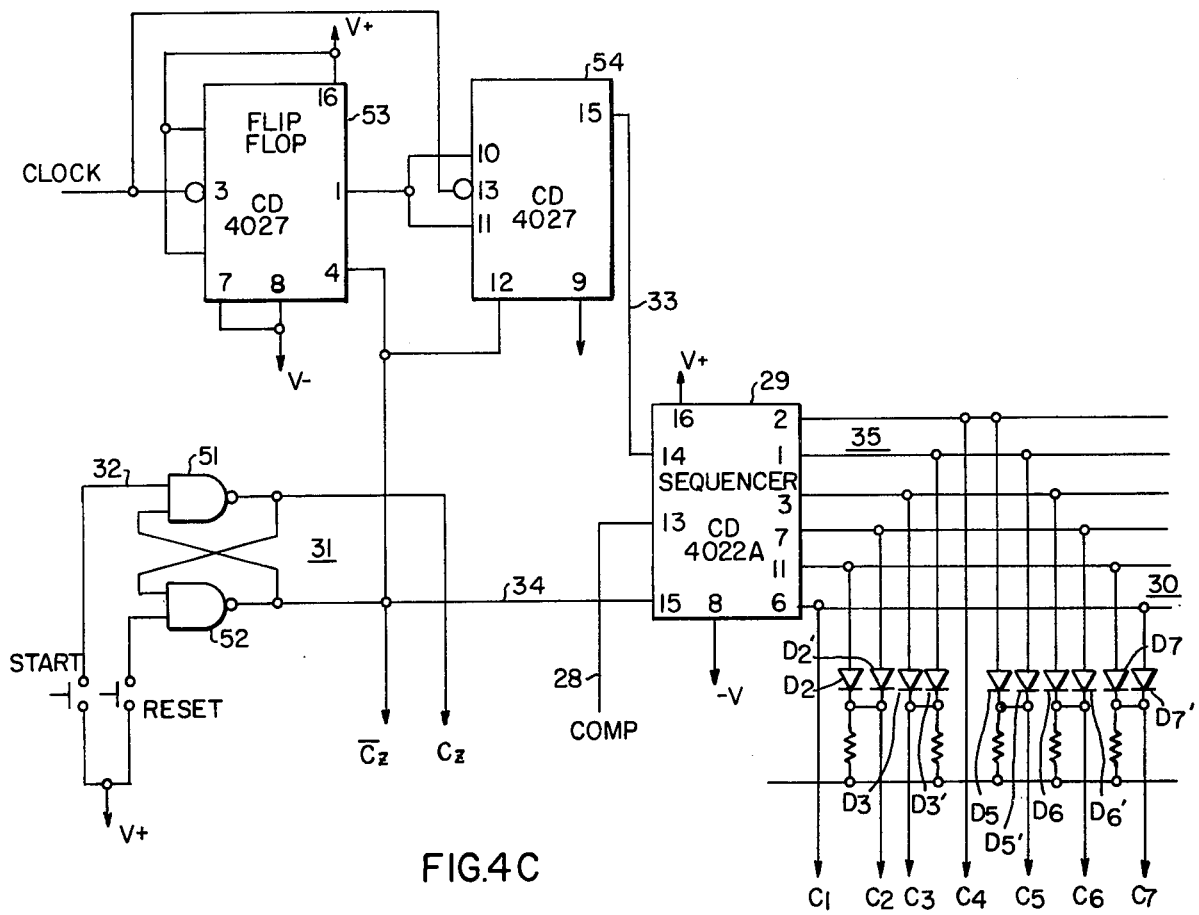

The circuit described hereabove lends itself to implementation as part of an overall data acquisition system which is interfaced with a computerized digital system. Solid state switches are easily substituted for any of the switches $S_z$, and $S_1$ to $S_{n+1}$ of FIG. 1. The circuitry is readily adapted to be mounted by printed circuit technique on circuit boards. FIGS. 4A, 4B, 4C are typical of a circuit organization which has been derived from the circuits of FIGS. 1 and 2 for the preferred embodiment of the invention. Resistors $R_0$ to $R_{n-1}$ have received the values shown, namely: two resistors of 100 and 200 ohms are mounted in parrallel to define $R_0$; $R_1 = 100$ ohms; $R_2 = 500$ ohms; $R_3 = 1K\Omega$, $R_4 = 5K\Omega$ and $R_5 = 10K\Omega$. The circuitry of FIGS. 4A, 4B, 4C represents the breadboards at the disposal of the user in the field. Elements also found in FIGS. 1 and 2 are identified by like reference numerals.

Referring to FIG. 4A a differential amplifier is shown as including two pairs of cascaded operational amplifiers 43, 45 and 44, 46 instead of the single operational amplifiers 1, 2 shown in FIG. 1. The input switch $S_z$ is in the form of a solid state device 41 sold on the open market under the code CD4016A. Control signal $C_z$ and the complementary signal $\overline{C_z}$ are applied to pins 5, 6 and 13, 12 of the device, respectively. The differential input signal received from the multiplexer (not shown) on terminals 7, 8 is applied between pin 1 and pin 11 of the device. The common ground is connected to input pins 4 and 8. Supply voltage $V_+$ $V_-$ are applied pins 14 and 7, respectively. Input lines 5 and 6 to the selective gain amplifier 50 are derived from respective pairs of pins 2, 3 and 9, 10 on device 41.

Of the two pairs of cascaded operational amplifiers of the differential amplifier the first of (43 or 44) is a solid state device known as the LM312, the second (45 or 46) is of the LM741 type. The LM312 is known on the open market as a micropower operational amplifier with very low offset voltage and input-current errors. The LM741 is a general purpose operational amplifier also sold on the open market.

For the gain setting, two solid state switching devices 47, 48 are disposed in the feedback loop on either side of the central resistor $R_0$. These two monolithic devices have the same switching capability as the switches $S_1$ to $S_7$. These solid state devices are sold on the open market as the type CD4016A. Pins 1, 4, 8 and 11 of device 47 are equivalent to the input terminals of switches $S_7$, $S_5$, $S_3$ and $S_1$ respectively, whereas in device 48, pins 1, 4, 8 are equivalent to the input terminals of switches $S_2$, $S_4$ and $S_6$. The feedback lines 15 and 16 are derived from pins 2, 3, 9, 10 of device 47 and pins 2, 3, 9 of device 48, respectively. control lines $C_1$, $C_3$, $C_5$, $C_7$ are accordingly connected to pins 12, 6, 5 and 13 on device 47, while control lines $C_2$, $C_4$, $C_6$ are connected to pins 13, 5 and 6 of device 48. Lines 11 and 12 are connected to terminals 13, 14.

Referring to FIG. 4B, the differential voltage present between terminals 13 and 14 is amplified and converted to a single ended voltage $V_0$ by the operational amplifier 17. Output signal $V_0$ is applied through line 19 to the A/D converter 60. The amplifier is of the LM741 type.

Line 18 also supplies signal $V_0$ to the window comparator 40. The latter comprises two LM311 solid state devices 20, 21. One has a voltage reference $V_M$ (positive), the other a voltage reference $V_m$ (negative), supplied to the noninverting and inverting terminals, respectively. Line 18 supplies the voltage $V_0$ to the two other inputs so as to permit a comparison of the signal $V_0$, for each polarity, by the respective devices 20, 21. Output lines 26, 27 of the devices are joined to the common line 28 carrying the digital signal COMP from either line to the sequencer 29 (FIG. 4C).

Referring now to FIG. 4C, the sequencer 29 appears in the form of a monolithic device of the type sold on the market as CD4022A. This is a COS/MOS Divide-By-8 Counter/Divider with 8 decoded outputs. The decoded outputs are connected via lines 35 to the logic state lines of the R.O.M. 30. The digital signal COMP on line 28 has two states: one for Enable, the other for Inhibit. This signal is fed to pin 13 of the device. A conventional latch circuit 31, comprised of NAND gates 51, 52, generates a "start" signal on lines $C_z$ and $\overline{C_z}$ when the "start" push button is depressed, and a "reset" signal on line 34 when the "reset" push button is depressed. These push buttons indeed are symbolic, since actually digital operation synchronized with operation of the multiplexer is in order, as well known in analog data acquisition systems of this kind. Line 34 is connected to pin 15 of device 29. Also, two cascaded flip flops 53, 54 respond to a clock signal for producing on line 33 the synchronizing signal on pin 14 of the octal sequencer 29 for turning the counts thereof.

The R.O.M. is similar to the one shown by FIG. 3. Pairs of diodes $D_1$, $D_1' \ldots D_7'$ establish on lines $C_1 \ldots C_7$ the proper pairing for control of devices 47, 48 of FIG. 4A.

THE DATA ACQUISITION SYSTEM

Figure 5:
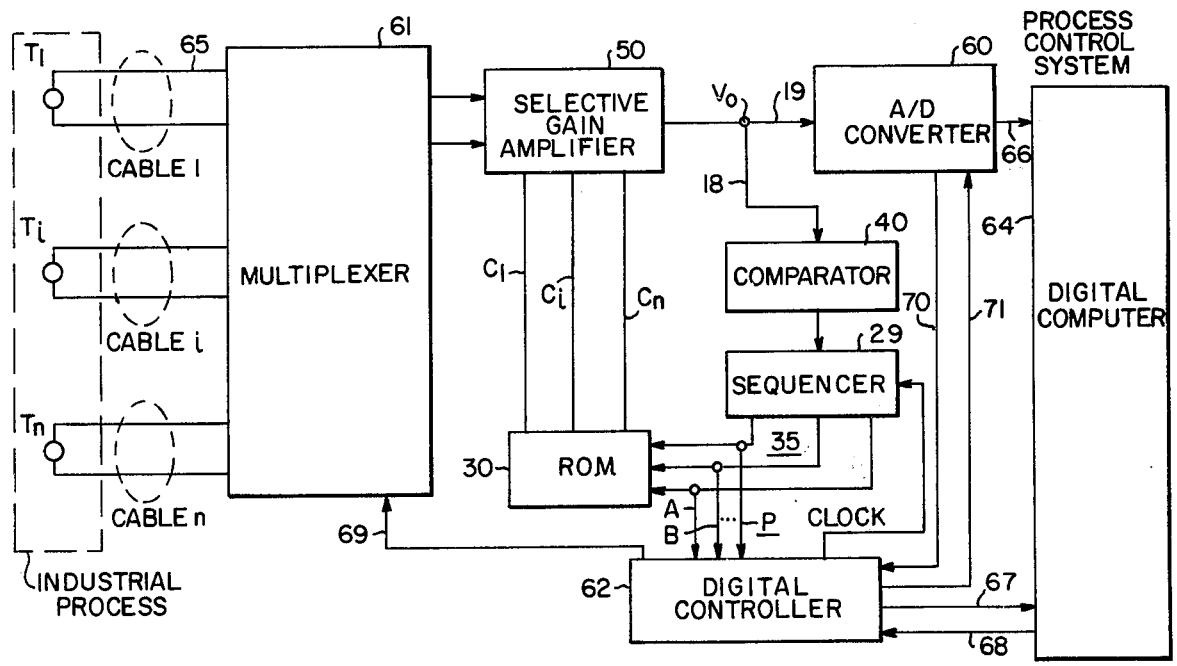
FIG. 5 is a schematic diagram of the overall analog data acquisition system in accordance with the teachings of this invention, shown interfaced with a digital computer and within a controlled industrial process.

FIG. 5 more generally shows the adjustable gain controlled amplifier apparatus in circuit within an analog data acquisition system. Remotely located transducers $T_1, \ldots T_i, \ldots T_n$ are supplying analog data along shielded cables $1, \ldots i, \ldots n$ including twisted wires 65. These cables form the several inputs of a multiplexer 61 supplying in sequence analog input signals to the input terminals 7, 8 of the selective gain amplifier 50. At the output 18, the amplified analog signal is supplied via line 19 to an A/D converter 60, generating on line 66 digital data to be processed by a digital computer (not shown) which is part of a process control system 64 and associated with an industrial process 63 which includes the sensing devices $T_1, T_i, \ldots T_n$. If the amplified output analog signal $V_0$ exceeds the reference voltage defined by the window comparator 40, the digital loop including line 28, sequencer 29, decoder lines 35, R.O.M. 30 and control lines $C_1, \ldots C_{n+1}$ to the selective gain amplifier 50 is activated, until a proper gain setting in reached within the selective gain amplifier 50.

The multiplexer 61 is controlled by a digital controller 62 through line 69 the digital controller 62 also generates a clock signal for the sequencer 29, and controls the A/D converter 60 via lines 70, 71. The multiplexer 61, the A/D converter 60 and the adjustable gain-controlled amplifier apparatus according to the present invention, together form an analog multiplexing substation AMS around which have been grouped transducers $T_1, \ldots T_i, \ldots T_n$. The AMS substation is remote from the control digital computer system of the digital process control system. It is observed that for each channel requiring a particular gain setting a particular coded instruction is present on decoder lines 35. Accordingly these lines logically identify the gain setting required. Therefore, via lines A, B, ... P from lines 35, the digital controller 62 and therefore the digital computer at any given time knows which channel or type of transducer has been selected by the multiplexer under a scanning signal on line 69 thereto. In correlation the gain setting achieved when the sequencer has been inhibited in position by the digital COMP signal on line 28 is known. At the same time, from the dialogue between the AMS station and the central computer along lines 67 and 68, processing of the digital data from line 66 is made possible by such identification of the channel, or gain setting. The analog data can be read in scale by the A/D converter 66 in accordance with the operative gain setting.

Indeed variations from the illustrated analog data acquisition system of FIG. 5 are possible while remaining within the scope of the present invention. For instance, instead of using a window comparator to detect a condition in the analog input signal for which signal $V_0$ is excessive, it is possible to use an overrange detector within the A/D converter such as disclosed in U.S. Pat. No. 3,806,916 of R.A. Diaz et al. Also the digital count of the A/D converter 66 may be brought up to scale directly at the output thereof, thus within the AMS substation, rather than treated at a distance by the control computer.

From the preceding description of the invention several important features are observed.

In the prior art data acquisition and process control systems, many remote points of measurement, or sensing, were grouped through long runs of expensive twisted shielded pairs of cables connected by multiplexing to an analog-to-digital converter which together with the multiplexer is usually in close proximity to the digital computer. By using local analog multiplexer substations (AMS), closer to the points of measurement such cabling is advantageously reduced. The digital data derived from the AMS are treated by the central digital computer which controls at a distance the operation of the multiplexer and the A/D converter of the AMS in relation to the various transducers called for at such remote locations. Since the analog transducer outputs generally vary in amplitude over a wide range, and must be amplified in accordance thereto, each channel has to be identified and an address indicating the gain setting must be provided. The coded indication of the gain is used by the computer to translate the corresponding digital data from the A/D converter into a digital number having the desired accuracy. Besides storage of a channel address and a gain setting in the memory of the computer software programming is needed in order to randomly access each channel at the appropriate time in the acquisition or control sequence. Such a system requires considerable core memory and software which are very costly.

If several analog transducers having outputs of the same order of magnitude can be grouped together around a common A/D converter to form an analog multiplexing substation (AMS) not ony are long runs of instrumentation cabling no longer necessary but also conversion of the associated analog signals can be readily handled by the A/D converter of the local AMS station without any need for identifying the gain setting of each channel within the AMS. The AMS substation is able to sequence through the grouped analog channels performing an A/D conversion on each channel independently from the computer operations. The information is either first stored, or transmitted directly to the computer interface. Much of the software and core memory can be so eliminated besides the long cabling runs.

However, it may not be possible to group together only transducers having outputs of the same order of magnitude. Then different gain settings must be provided and it remains for digital treatment to determine for each channel what particular gain setting must be used and has been used in the conversion. An amplifier of variable gain can be used, and the computer for each channel will impose the necessary setting in relation to the nature of the particular channel. For instance, if the transducer is a thermocouple the gain will be as required to amplify millivolt signals. If however, the transducer is a pressure transducer, the gain will be selected in relation to input signals of the order of the volt. It is desirable however, not to have to communicate in each instance with the computer, first to identify the channel, then to select the gain setting.

The prior art overcomes this problem by providing a local selection of the gain on a one to one basis with reference to the selected channels. At the local AMS station a programmed read only memory (R.O.M) or a matrix of manual single-pole single-throw (SPST) switches are so set that for each particular channel that can be selected a particular gain setting is assigned through the R.O.M. diodes, or the SPST switches as set in advance. Nevertheless, this method of selecting gains in accordance with the operative channel is costly. In particular, switching must be set for as many gains as there are channels to be selected. Besides, experience has proved that coding of the channels with respect to the desired gain setting in the field is likely to become confusing.

In contrast, the present invention proposes to use an automatic gain-controlled amplifier apparatus, e.g. a system in which the gain is automatically selected through a feedback loop by reference to an overrange condition. No longer is it necessary to identify the channel in order to select the gain setting from the matrix. The gains are logically defined in an array by a combination of columns in relation to a particular line identifying the order of succession of the selectable gains. The selection no longer depends upon the identification of a particular channel. Rather, the lines of the matrix are sequenced in accordance with a prearranged succession of gain settings and for each gain setting of the sequence so selected the amplifier is set at the corresponding gain. The analog derived for the particular channel so amplified is tested against a reference signal. The sequence is stopped when the proper relation to the reference signal has been reached.

This is a most practical and economical way of adjusting the gain of an automatic gain control amplifier for use in remote analog multiplexing system.

To summarize, the advantages of the automatic gain-controlled amplifier apparatus according to the present invention are as follows:

1. It eliminates the need for pre-programming manual switches or read-only-memories for gain selection identification.
2. It allows the user to vary the gain ranges as needed for the wide variety of analog signals due to the randomness of grouping the transducers.
3. It also allows the user to implement only the exact number of gain range needed.
4. A gain code is included with the digital data code for each channel selected independent of computer control.
5. The method by which each gain range is changed makes it possible to use inexpensive solid-state switches.
6. A very high inpedance can be achieved with this amplifier configuration.

We claim:

1. In a data acquisition system including a central computer and at least one remote station comprising one multiplexer connected to a plurality of points for deriving input analog signals of different amplitude ranges, an analog-to-digital converter associated with said multiplexer for providing digital data representative of said intput analog signals and means for controlling said multiplexer and analog-to-digital converter in relation to said points severally, the combination of:

adjustable gain amplifier means in said station responsive to said input analog signals as derived from said multiplexer for supplying amplified input signals to said converter;

said amplifier means including a plurality of elemental circuits each contributing at least in part to one of a plurality of definite gain settings thereof;

switching means in said station for operatively connecting a selection of said elemental circuits to establish one of said gain settings;

programmable logic memory means in said station for controlling said switching means to establish successive gain settings in accordance with a plurality of sequence instructions;

sequencer means in said station for applying to said memory means a plurality of said sequence instructions, said sequence instructions corresponding to a succession of said gain settings representing a monotonic succession of gains;

the operation of said sequencer means being initiated by said control means and gated by out-of-range condition of said amplifier means and being terminated in response to an in-range condition of said amplifier means, whereby said amplifier means automatically supplies to said converter amplified input signals of effective amplitude, said control means being adapted to transmit from said remote station to said central computer said input analog signal representative digital data and digital address data identifying the multiplexed input signals of said remote station and digitally coded data from said sequencer means characterizing the associated operative gain setting of said amplifier means in said remote station.

2. The data acquisition system of claim 1 in which said amplifier means includes first and second operational amplifiers differentially mounted between said multiplexer and said analog to digital converter;

with said elemental circuits forming a serial network of resistance $R_T$ between the outputs of said first and second operational amplifier, said serial network including a central resistor $R_0$ and $(n-1)$ resistors distributed about said central resistor $R_o$ to form two sets of odd and even numbered resistors $R_1 \ldots R_{n-1}$ and $R_2 \ldots R_{n-2}$, respectively, said first and second operational amplifiers being associated with said odd and even numbered sets of resistors, respectively;

with said sets of resistors being multiplexed by said switching means to establish selected configurations of feedback connections with the respective said first and second operational amplifiers; and with said programmable memory means including output lines for controlling said switching means in relation with selected ones of said resistors, said resistors being defined by the formula:

$$R_i = \frac{G_1 R_0 - G_{i+1} \sum_{n=0}^{i-1} R_n}{G_{i+1}}$$

where $R_0 = R_T G_1$ and where $G_{i+1}$ is the gain desired for the rank $i+1$, when the resistor to be calculated is $R_1$ for the rank $i$.

* * * * *